United States Patent
Irobe et al.

(10) Patent No.: US 11,641,771 B2
(45) Date of Patent: May 2, 2023

(54) ELECTRO-OPTICAL DEVICE AND ELECTRONIC APPARATUS

(71) Applicant: SEIKO EPSON CORPORATION, Tokyo (JP)

(72) Inventors: Jun Irobe, Chino (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 288 days.

(21) Appl. No.: 17/161,625

(22) Filed: Jan. 28, 2021

(65) Prior Publication Data
US 2021/0233965 A1  Jul. 29, 2021

(30) Foreign Application Priority Data
Jan. 29, 2020  (JP) .............................. JP2020-012248

(51) Int. Cl.
*H01L 27/32* (2006.01)

(52) U.S. Cl.
CPC ........ *H01L 27/322* (2013.01); *H01L 27/3216* (2013.01)

(58) Field of Classification Search
CPC .......................... H01L 27/322; H01L 27/3216
See application file for complete search history.

(56) References Cited

U.S. PATENT DOCUMENTS

| | | | | |
|---|---|---|---|---|
| 10,810,924 B2 * | 10/2020 | Koshihara | ............ | G09G 3/2003 |
| 2008/0036367 A1 | 2/2008 | Eida et al. | | |
| 2011/0043096 A1 | 2/2011 | Asaki | | |
| 2013/0127326 A1 | 5/2013 | Asaki | | |
| 2015/0060906 A1 | 3/2015 | Asaki | | |
| 2015/0155346 A1 | 6/2015 | Motoyama et al. | | |
| 2017/0236464 A1 | 8/2017 | Koshihara | | |
| 2018/0219050 A1 | 8/2018 | Ota et al. | | |
| 2019/0005863 A1 | 1/2019 | Koshihara | | |
| 2019/0035862 A1 | 1/2019 | Koshihara | | |
| 2019/0056543 A1 | 2/2019 | Ueda | | |
| 2019/0305051 A1 | 10/2019 | Takahashi et al. | | |
| 2021/0098536 A1 | 4/2021 | Takahashi et al. | | |

FOREIGN PATENT DOCUMENTS

| | | |
|---|---|---|
| JP | 2011040352 | 2/2011 |
| JP | 2014067576 | 4/2014 |
| JP | 2015050096 | 3/2015 |
| JP | 2018022063 | 2/2018 |
| JP | 2018124540 | 8/2018 |
| JP | 2018128683 | 8/2018 |

(Continued)

*Primary Examiner* — Anne M Hines
*Assistant Examiner* — Jose M Diaz
(74) *Attorney, Agent, or Firm* — JCIPRNET

(57) ABSTRACT

An electro-optical device includes a first light-emitting element including a first light-emitting region, a second light-emitting element including a second light-emitting region, a first filter, and a second filter. The area of the first light-emitting region is smaller than the area of the second light-emitting region, and a relationship (Lf11−Le11)> (Lf21−Le21) is satisfied when the length of the first light-emitting region is Le11, the length of the second light-emitting region is Le21, the length of the first filter is Lf11, and the length of the second filter is Lf21.

15 Claims, 8 Drawing Sheets

(56) References Cited

FOREIGN PATENT DOCUMENTS

| | | |
|---|---|---|
| JP | 2019012620 | 1/2019 |
| JP | 2019117941 | 7/2019 |
| JP | 2019185887 | 10/2019 |
| WO | 2006022123 | 3/2006 |
| WO | 2017169563 | 10/2017 |

* cited by examiner

ELECTRO-OPTICAL DEVICE AND ELECTRONIC APPARATUS

The present application is based on, and claims priority from JP Application Serial Number 2020-012248, filed Jan. 29, 2020, the disclosure of which is hereby incorporated by reference herein in its entirety.

BACKGROUND

1. Technical Field

The present disclosure relates to an electro-optical device and an electronic apparatus.

2. Related Art

An electro-optical device including light-emitting elements such as organic electroluminescence (EL) elements is known. In this type of device, for example, as disclosed in JP-A-2019-117941, typically, a color filter is provided that transmits light in a predetermined wavelength region, of light from a light-emitting element.

JP-A-2019-117941 discloses technology for keeping constant a gap between light-emitting regions of the light-emitting elements between two adjacent sub-pixels, for the purpose of suppressing variations in color changes in an observation direction.

In the technology described in JP-A-2019-117941, there is a risk that when shapes and areas of the light-emitting regions of the light-emitting elements between the two adjacent sub-pixels are different from each other, sufficient visual field angle characteristics cannot be obtained. Further, in the technology described in JP-A-2019-117941, there is also a risk that when light distribution characteristics of the light-emitting regions of the light-emitting elements between the two adjacent sub-pixels are different, the sufficient visual field angle characteristics cannot be obtained.

SUMMARY

An aspect of an electro-optical device according to the present disclosure includes a first light-emitting element configured to emit first light from a first light-emitting region, a second light-emitting element configured to emit second light from a second light-emitting region, a first filter configured to transmit, of the first light, light in a first wavelength region, and a second filter configured to transmit, of the second light, light in a second wavelength region different from the first wavelength region. An area of the first light-emitting region is smaller than an area of the second light-emitting region, and a relationship $(Lf11-Le11)>(Lf21-Le21)$ is satisfied when a length of the first light-emitting region along a first axis is $Le11$, a length of the second light-emitting region along the first axis is $Le21$, a length of the first filter along the first axis is $Lf11$, and a length of the second filter along the first axis is $Lf21$.

Another aspect of an electro-optical device according to the present disclosure includes a first light-emitting element configured to emit first light from a first light-emitting region, a second light-emitting element configured to emit second light from a second light-emitting region, a first filter configured to transmit, of the first light, light in a first wavelength region, and a second filter configured to transmit, of the second light, light in a second wavelength region different from the first wavelength region. A relationship $Le11<Le21$, a relationship $Le12>Le22$, and a relationship $(Lf11-Le11)>(Lf21-Le21)$ are satisfied when a length of the first light-emitting region along a first axis is $Le11$, a length of the first light-emitting region along a second axis that intersects the first axis is $Le12$, a length of the second light-emitting region along the first axis is $Le21$, a length of the second light-emitting region along the second axis is $Le22$, a length of the first filter along the first axis is $Lf11$, and a length of the second filter along the first axis is $Lf21$.

Another aspect of an electro-optical device according to the present disclosure includes a first light-emitting element configured to emit first light from a first light-emitting region, a second light-emitting element configured to emit second light from a second light-emitting region, a first filter configured to transmit, of the first light, light in a first wavelength region, and a second filter configured to transmit, of the second light, light in a second wavelength region different from the first wavelength region. A spread angle of the first light is smaller than a spread angle of the second light, and a relationship $(Lf11-Le11)>(Lf21-Le21)$ is satisfied when a length of the first light-emitting region along a first axis is $Le11$, a length of the second light-emitting region along the first axis is $Le21$, a length of the first filter along the first axis is $Lf11$, and a length of the second filter along the first axis is $Lf21$.

An aspect of an electronic apparatus according to the present disclosure includes the electro-optical device according to the above-described aspect, and a control unit configured to control an operation of the electro-optical device.

DESCRIPTION OF EXEMPLARY EMBODIMENTS

Figure 1:
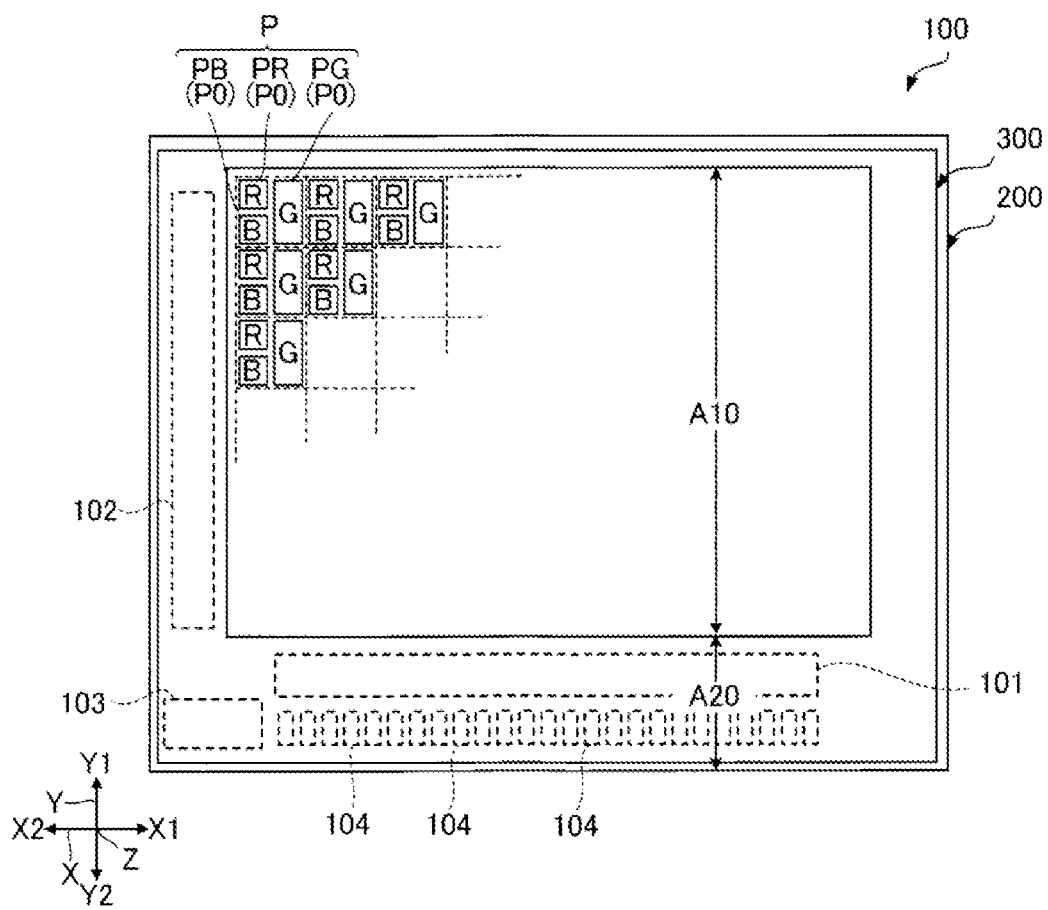
FIG. 1 is a plan view schematically illustrating an electro-optical device according to a first embodiment.

Preferred embodiments of the present disclosure will be described below with reference to the accompanying drawings. Note that, in the drawings, dimensions and scales of each component are different from actual dimensions and scales as appropriate, and some of the components are schematically illustrated to make them easily recognizable. Further, the scope of the present disclosure is not limited to those embodiments unless otherwise stated to limit the present disclosure in the following descriptions.

1. Electro-optical Device

1A. First Embodiment 1A-1. Electro-optical Device

FIG. 1 is a plan view schematically illustrating an electro-optical device 100 according to a first embodiment. The electro-optical device 100 is a device that displays an image using organic EL. The electro-optical device 100 is a micro display that is favorably used as a head-mounted display and the like, for example.

The electro-optical device 100 will be described below. Note that, for convenience of explanation, the description will be made using, as appropriate, an X-axis, a Y-axis, and a Z-axis that are orthogonal to each other. Further, one direction along the X-axis will be referred to as a direction X1, and a direction opposite to the direction X1 will be referred to as a direction X2. Similarly, one direction along the Y-axis will be referred to as a direction Y1, and a direction opposite to the direction Y1 will be referred to as a direction Y2. One direction along the Z-axis will be referred to as a direction Z1, and a direction opposite to the direction Z1 will be referred to as a direction Z2. Further, viewing in the direction Z1 or the direction Z2 will be referred to as "plan view". In the present embodiment, the X-axis is an example of a first axis, and the Y-axis is an example of a second axis.

The electro-optical device 100 includes a display region A10 in which an image is displayed, and a peripheral region A20 surrounding the periphery of the display region A10 in plan view. In an example illustrated in FIG. 1, the shape of the display region A10 in plan view is quadrangular. Note that the shape of the display region A10 in plan view is not limited to the example illustrated in FIG. 1, and may be another shape.

The display region A10 is configured by a plurality of pixels P. Each of the pixels P is a minimum unit in terms of the image display. The plurality of pixels P are arranged in rows and columns along the X-axis and the Y-axis, for example. Each of the pixels P includes a sub-pixel PB from which light of a wavelength region of blue can be obtained, a sub-pixel PG from which light of a wavelength region of green can be obtained, and a sub-pixel PR from which light of a wavelength region of red can be obtained. Note that, in the description below, when the sub-pixel PB, the sub-pixel PG, and the sub-pixel PR are not differentiated from each other, they will be referred to as a sub-pixel P0 or sub-pixels P0.

As illustrated in FIG. 1, the electro-optical device 100 includes an element substrate 200 and a transmissive substrate 300 having optical transparency. The electro-optical device 100 has a so-called top-emitting structure. The electro-optical device 100 emits light from the transmissive substrate 300. Note that the optical translucency refers to transparency with respect to visible light, and means that a transmittance of the visible light is preferably 50% or greater.

The element substrate 200 includes a data line drive circuit 101, a scanning line drive circuit 102, a control circuit 103, and a plurality of external terminals 104. The data line drive circuit 101, the scanning line drive circuit 102, the control circuit 103, and the plurality of external terminals 104 are disposed in the peripheral region A20. The data line drive circuit 101 and the scanning line drive circuit 102 are peripheral circuits that control driving of the plurality of sub-pixels P0. The control circuit 103 controls driving of the data line drive circuit 101 and the scanning line drive circuit 102. Image data is supplied to the control circuit 103 from an upper circuit (not illustrated). The control circuit 103 supplies various signals based on the image data to the data line drive circuit 101 and the scanning line drive circuit 102. Although not illustrated, a flexible printed circuit (FPC) board for electrical coupling with the upper circuit or the like is coupled to the external terminals 104. Further, a power supply circuit (not illustrated) is electrically coupled to the element substrate 200.

The transmissive substrate 300 is a cover that protects the element substrate 200 and the like. The transmissive substrate 300 is configured, for example, by a glass substrate or a quartz substrate. The transmissive substrate 300 is joined to the element substrate 200 via an adhesive (not illustrated). The adhesive is, for example, a transparent adhesive using a resin material such as an epoxy resin and an acrylic resin.

Figure 2:
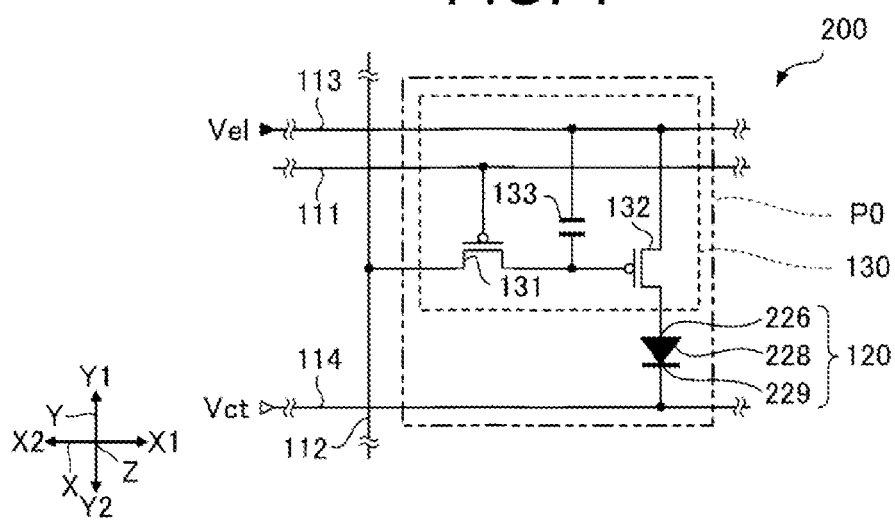
FIG. 2 is an equivalent circuit diagram of a sub-pixel illustrated in FIG. 1

FIG. 2 is an equivalent circuit diagram of the sub-pixel P0 illustrated in FIG. 1. The element substrate 200 is provided with a plurality of scanning lines 111, a plurality of data lines 112, a plurality of power supplying lines 113, and a plurality of power supplying lines 114. In FIG. 2, the single sub-pixel P0 and elements corresponding thereto are representatively illustrated.

The scanning lines 111 extend along the X-axis, and the data lines 112 extend along the Y-axis. Although not illustrated, the plurality of scanning lines 111 and the plurality of data lines 112 are arranged in a lattice shape. Further, although not illustrated, the scanning lines 111 are coupled to the scanning line drive circuit 102 illustrated in FIG. 1, and the data lines 112 are coupled to the data line drive circuit 101 illustrated in FIG. 1.

As illustrated in FIG. 2, the element substrate 200 includes a light-emitting element 120 and a pixel circuit 130 that supplies current to the light-emitting element 120 for each of the sub-pixels P0. The light-emitting element 20 is configured by an organic light-emitting diode (OLED). As will be described in more detail below, the light-emitting device 120 includes a pixel electrode 226, a common electrode 229, and an organic layer 228 disposed therebetween.

The power supplying line 113 is electrically coupled to the pixel electrode 226 via the pixel circuit 130. On the other hand, the power supplying line 114 is electrically coupled to the common electrode 229. Here, a power supply potential Vel on a high potential side is supplied from the power supply circuit (not illustrated) to the power supplying line 113. A power supply potential Vct on a low potential side is supplied from the power supply circuit (not illustrated) to the power supplying line 114. Thus, the pixel electrode 226 functions as an anode, and the common electrode 229 functions as a cathode. In the light-emitting element 120, the organic layer 228 generates light as a result of holes supplied from the pixel electrode 226 and electrons supplied from the common electrode 229 being recombined in the organic layer 228.

The pixel circuit 130 includes a switching transistor 131, a driving transistor 132, and a retention capacitor 133. A gate of the switching transistor 131 is electrically coupled to the scanning line 111. Further, one of a source and a drain of the switching transistor 131 is electrically coupled to the data line 112, and the other is electrically coupled to a gate of the driving transistor 132. One of a source and a drain of the driving transistor 132 is electrically coupled to the power supplying line 113, and the other is electrically coupled to the pixel electrode 226. One of electrodes of the retention capacitor 133 is coupled to the gate of the driving transistor 32, and the other electrode is coupled to the power supplying line 113.

In the pixel circuit 130 described above, when the scanning line 111 is selected as a result of the scanning line drive circuit 102 activating a scanning signal, the switching transistor 131 provided in the selected sub-pixel P0 is turned on. Then, a data signal is supplied from the data line 112 to the driving transistor 132 corresponding to the selected scanning line 111. The driving transistor 132 supplies a current corresponding to a potential of the supplied data signal, that is, a current corresponding to a potential difference between the gate and the source, to the light-emitting element 120. As a result, the light-emitting element 120 emits light at a luminance corresponding to a magnitude of the current supplied from the driving transistor 132. Then, when the scanning line drive circuit 102 releases the selection of the scanning line 111 and the switching transistor 131 is turned off, the potential of the gate of the driving transistor 132 is held by the retention capacitor 133. Thus, even after the switching transistor 131 is turned off, the light emission of the light-emitting element 120 can be maintained.

Note that the configuration of the pixel circuit 130 described above is not limited to the illustrated configuration. For example, the pixel circuit 130 may further include a transistor that controls conduction between the pixel electrode 226 and the driving transistor 132.

1A-2. Details of Element Substrate

Figure 3:
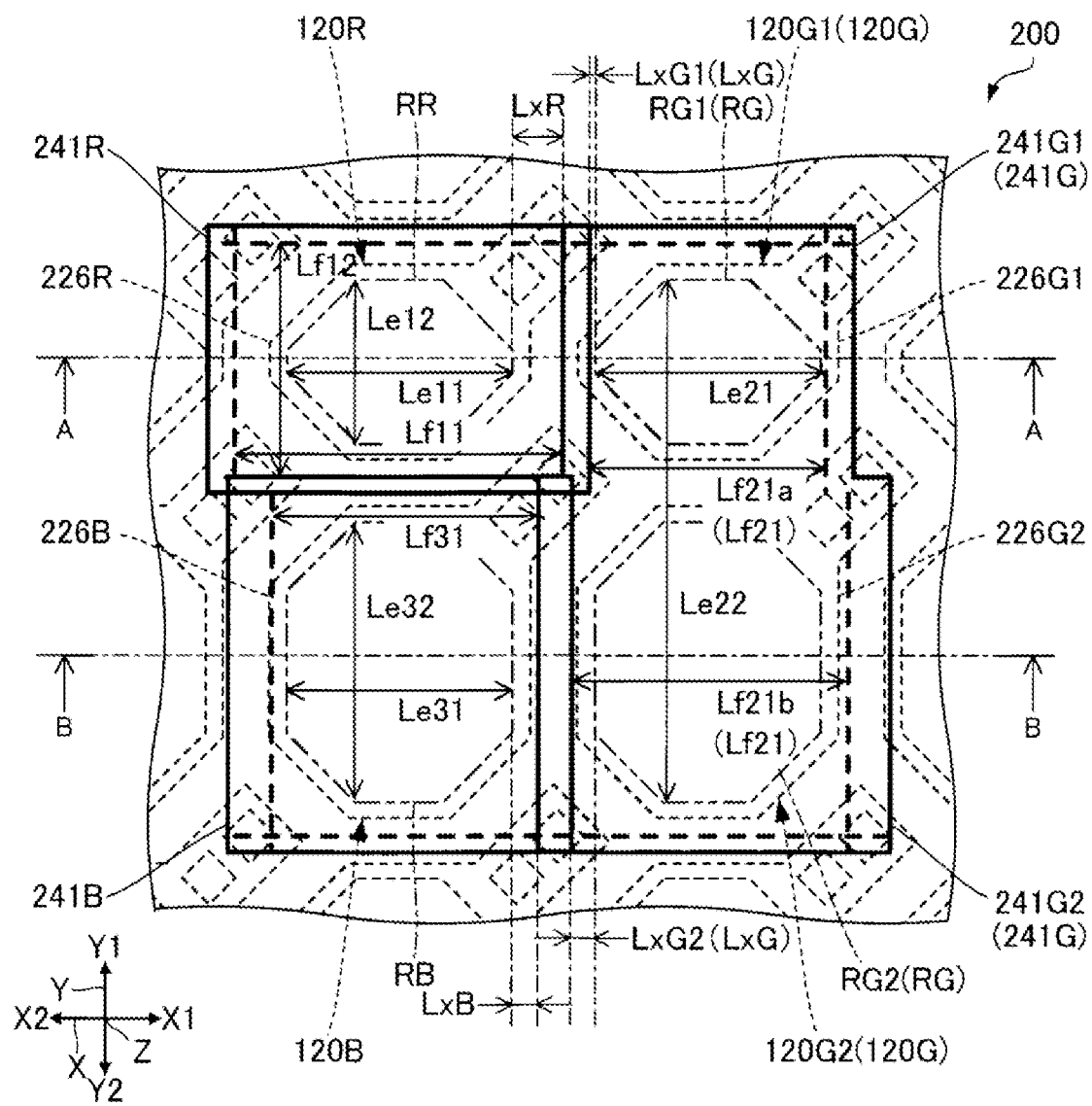
FIG. 3 is a plan view illustrating a part of an element substrate according to the first embodiment.
Figure 4:
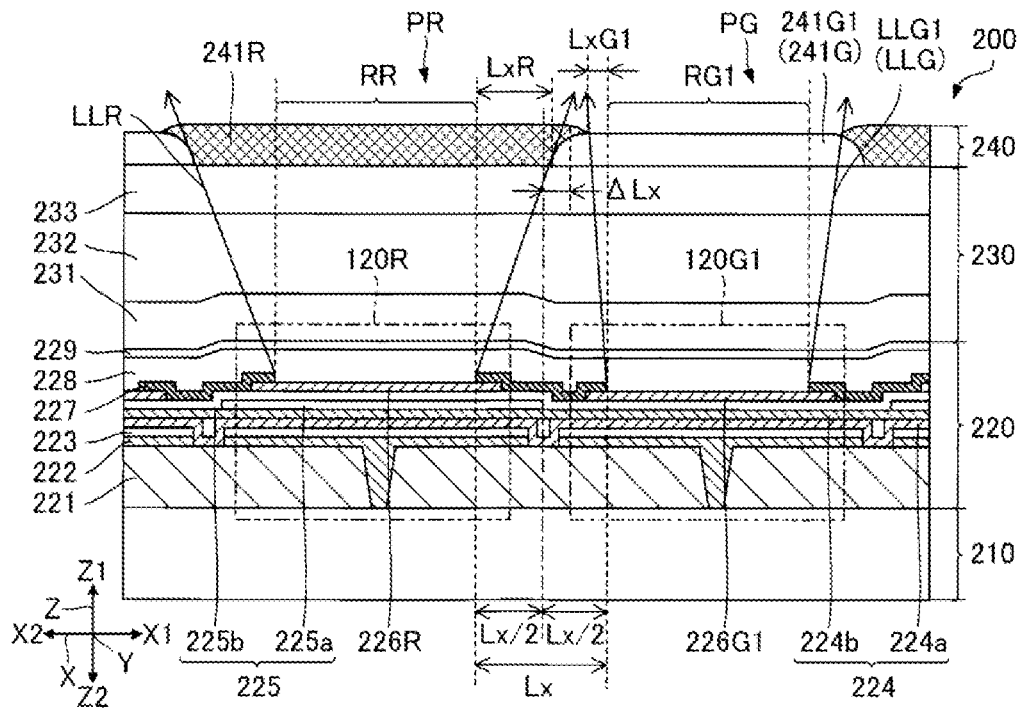
FIG. 4 is a cross-sectional view taken along a line A-A in FIG. 3.
Figure 5:
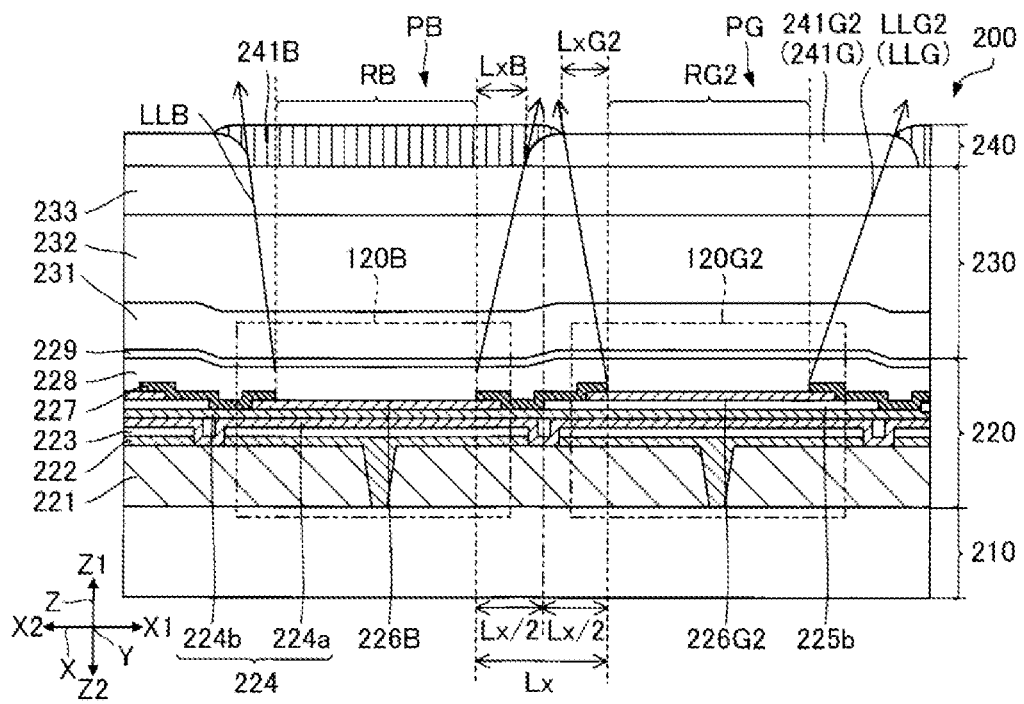
FIG. 5 is a cross-sectional view taken along a line B-B in FIG. 3.

FIG. 3 is a plan view illustrating a part of the element substrate 20 according to the first embodiment. FIG. 4 is a cross-sectional view taken along a line A-A in FIG. 3. FIG. 5 is a cross-sectional view taken along a line B-B in FIG. 3. In FIG. 3, of elements forming the element substrate 200, elements in the single pixel P are representatively illustrated.

As illustrated in FIG. 3, the element substrate 200 includes a set of light-emitting elements 120R, 120G1, 120G2, and 120B for each of the pixels P. The light-emitting element 120R is the light-emitting element 120 provided in the sub-pixel PR. Each of the light-emitting elements 120G1 and 120G2 is the light-emitting element 120 provided in the sub-pixel PG. The light-emitting element 120B is the light-emitting element 120 provided in the sub-pixel PB.

Here, the light-emitting 120R is an example of a first light-emitting element, each of the light-emitting elements 120G1 and 120G2 is an example of a second light-emitting element, and the light-emitting 120B is an example of a third light-emitting element. Note that the light-emitting elements 120G1 and 120G2 share the single pixel circuit 130 for each of the sub-pixels PG. Therefore, the light-emitting elements 120G1 and 120G2 may be considered as one light-emitting element 120G for each of the sub-pixels PG. Note that the pixel circuits 130 may be provided individually for the light-emitting elements 120G1 and 120G2.

In the present embodiment, the light-emitting elements 120R, 120G1, 120G2, and 120B are disposed in rows and columns along the X-axis and the Y-axis. Here, with respect to the light-emitting element 120R, the light-emitting element 120G1 is disposed in the direction X1, and the light-emitting element 120B is disposed in the direction Y2. The light-emitting element 120G2 is disposed in the direction Y2 with respect to the light-emitting element 120G1 and in the direction X1 with respect to the light-emitting element 120B.

The light-emitting device 120R includes a light-emitting region RR that emits light LLR for the sub-pixel PR as an example of a first light-emitting region. The light-emitting device 120G1 includes a light-emitting region RG1 that emits light LLG1 for the sub-pixel PG. The light-emitting device 120G2 includes a light-emitting region RG2 that emits light LLG2 for the sub-pixel PG. The light-emitting element 120B includes a light-emitting region RB that emits light LLB for the sub-pixel PB. Note that the light LLR is an example of first light, light LLG formed by the light LLG1 and the light LLG2 is an example of second light, and the light LLB is an example of third light. Further, the light-emitting regions RG1 and RG2 may be considered as one light-emitting region RG for each of the sub-pixels PG.

In an example illustrated in FIG. 3, each of the light-emitting regions RR, RG1, RG2, and RB forms an octagonal shape in plan view. The area of the light-emitting region RR is smaller than the area of each of the light-emitting regions RB and RG. Further, the area of the light-emitting region RR is equal to the area of the light-emitting region RG1. Further, the area of the light-emitting region RB is equal to the area of the light-emitting region RG2. Here, the area of the light-emitting region RR is smaller than the sum of the areas of the light-emitting regions RG1 and RG2. In other words, the area of the light-emitting region RR is smaller than the area of the light-emitting region RG. Note that the "area" of each of these regions refers to an area in plan view. Further, the area of the light-emitting region RR may be different from the area of the light-emitting region RG1. Further, the shape of each of the light-emitting regions RR, RG1, RG2, and RB is not limited to the octagonal shape, and may be another shape. Further, the shapes of the light-emitting regions RR, RG1, RG2, and RB in plan view may be different from each other.

In the present embodiment, a length Le11 of the light-emitting region RR along the X-axis is longer than a length Le12 of the light-emitting region RR along the Y-axis. A length Le21 of the light-emitting region RG along the X-axis is shorter than a length Le22 of the light-emitting region RG along the Y-axis. A length Le31 of the light-emitting region RB along the X-axis is shorter than a length Le32 of the light-emitting region RB along the Y-axis.

As illustrated in FIG. 4 and FIG. 5, the element substrate 200 includes a substrate 210, a light-emitting element layer 220, a protective layer 230, and a color filter 240. These layers are layered in this order in the direction Z1. Note that each of the layers forming the element substrate 200 is formed using a known film forming method as appropriate.

The substrate 210 is, for example, a silicon substrate. Although not illustrated, the pixel circuit 130 described above and various wiring lines coupled thereto are formed on the substrate 210. Note that the substrate 210 is not limited to the silicon substrate, and may be, for example, a glass substrate, a resin substrate, or a ceramic substrate. In the present embodiment, since the electro-optical device 100 is the top-emitting type, the substrate 210 need not have the optical transparency. Each of the above-described transistors included in the pixel circuit 130 may be a MOS transistor, a thin film transistor, or a field effect transistor. When the transistor included in the pixel circuit 130 is the MOS transistor including an active layer, the active layer may be configured by a silicon substrate. Further, examples of the material of each of the components and each of the various wiring lines configuring the pixel circuit 130 include conductive materials such as polysilicon, metal, metal silicide, and a metallic compound.

The light-emitting element layer 220 is a layer including the light-emitting elements 120R, 120G1, 120G2, and 120B. Specifically, the light-emitting element layer 220 includes an insulating layer 221, a reflection layer 222, a reflection enhancing layer 223, an insulating layer 224, a distance adjustment layer 225, a plurality of pixel electrodes 226R, 226G1, 226G2, and 226B, an element separation layer 227, an organic layer 228, and the common electrode 229. These layers are layered in this order in the direction Z1.

The insulating layer 221 is an interlayer insulating film disposed between the substrate 210 and the reflection layer 222. The insulating layer 221 is formed from an insulating material such as silicon oxide ($SiO_2$), for example.

The reflection layer 222 is a layer having light reflectivity that reflects, in the direction Z1, light generated in the organic layer 228. Although not illustrated, the reflection layer 222 is divided into a plurality of portions arranged in rows and columns so as to correspond to the plurality of sub-pixels P0 in plan view. Examples of the constituent material of the reflection layer 222 include metals such as Al (aluminum), Ag (silver), Cu (copper), and Ti (titanium), alloys of any of these metals, and the like. For example, the reflection layer 222 is formed by a layered body of a film composed of Ti and a film composed of an alloy containing Al and Cu. In an example illustrated in FIG. 4 and FIG. 5, the reflection layer 222 also functions as a wiring line. Although not illustrated, for example, the wiring line is electrically coupled to the pixel circuit 130 described above. Note that the reflection layer 222 need not necessarily function as the wiring line. In this case, a wiring line is provided separately from the reflection layer 222. Further, the light reflectivity refers to reflectivity with respect to visible light, and means that a reflectance of visible light is preferably 50% or greater.

The reflection enhancing layer 223 is a layer having optical transparency and insulating properties for enhancing the light reflectivity of the reflection layer 222. The reflection enhancing layer 223 is disposed in a range extending over the entire area of the reflection layer 222 in plan view. The reflection enhancing layer 223 is formed by a silicon oxide film, for example.

The insulating layer 224 includes a first insulating layer 224a and a second insulating layer 224b. The first insulating layer 224a fills spaces between the divided portions of the reflection layer 222 and the reflection enhancing layer 223, and is disposed over the entire area on the reflection enhancing layer 223. The second insulating layer 224b is disposed over the entire area on the first insulating layer 224a. Each of the first insulating layer 224a and the second insulating layer 224b is formed by a silicon nitride (SiN) film, for example.

The distance adjustment layer 225 is a layer having optical transparency and insulating properties for adjusting a distance between the reflection layer 222 and the common electrode 229 for each of the sub-pixels P0. The distance adjustment layer 225 includes a first distance adjustment layer 225a and a second distance adjustment layer 225b. Each of the first distance adjustment layer 225a and the second distance adjustment layer 225b is formed by a silicon oxide film, for example.

Of the sub-pixels PR, PG, and PB, the first distance adjustment layer 225a is disposed in the sub-pixel PR, and is not disposed in the sub-pixels PG and PB. Of the sub-pixels PR, PG and PB, the second distance adjustment layer 225b is disposed in the sub-pixels PR and PG, and is not disposed in the sub-pixel PB Therefore, the first distance adjustment layer 225a and the second distance adjustment layer 225b are disposed in the sub-pixel PR. Of the first distance adjustment layer 225a and the second distance adjustment layer 225b, the second distance adjustment layer 225b is disposed in the sub-pixel PG. Neither the first distance adjustment layer 225a nor the second distance adjustment layer 225b is disposed in the sub-pixel PB.

One of the pixel electrodes 226R, 226G1, 226G2, and 226B is provided for each of the sub-pixels P0, and each of the pixel electrodes 226R, 226G1, 226G2, and 226B is a layer having conductivity and optical transparency. However, the pixel electrodes 226G1 and 226G2 are shared in the sub-pixel PG. Examples of the constituent material of each of the pixel electrodes 226R, 226G1, 226G2, and 226B include a transparent conductive material such as indium tin oxide (ITO) or indium zinc oxide (IZO), for example.

The pixel electrode 226R is the pixel electrode 226 provided in the sub-pixel PR. The pixel electrodes 226G1 and 226G2 are the pixel electrodes 226 provided in the sub-pixel PG. The pixel electrode 226B is the pixel electrode 226 provided in the sub-pixel PB.

The element separation layer 227 is an insulating layer covering the outer edges of each of the pixel electrodes 226R, 226G1, 226G2, and 226B. The element separation layer 227 is formed from an insulating material such as silicon oxide, for example. The element separation layer 227 is provided with a plurality of openings by which a predetermined region of each of the pixel electrodes 226R, 226G1, 226G2, and 226B is caused to be in contact with the organic layer 228. The plurality of openings define the light-emitting regions RR, RG1, RG2, and RB.

The organic layer 228 is a layer formed from an organic compound as a main material. Specifically, the organic layer 228 includes a light-emitting layer that emits light through energization. In the present embodiment, the light-emitting layer includes, for example, a light-emitting layer from which a red light emission color can be obtained, a light-emitting layer from which a green light emission color can be obtained, and a light-emitting layer from which a blue light emission color can be obtained, and these light-emitting layers are layered as appropriate. Thus, light emission of a white color or a color similar to the white color is achieved in the organic layer 228. Note that a known configuration and a known material can be employed for the organic layer 228. Although not illustrated, the organic layer 228 includes, as appropriate, a hole injecting layer, a hole transport layer, an electron transport layer, an electron injecting layer, or the like, as necessary, in addition to the light-emitting layer. Further, the organic layer 228 may include a layer formed from an inorganic material such as metal, as necessary.

The common electrode 229 is commonly provided for the sub-pixels PR, PG, and PB and is a layer having light reflectivity, optical transparency, and conductivity. Examples of the constituent material of the common electrode 229 include alloys such as MgAg containing Ag.

In the light-emitting element layer 220 described above, the light-emitting element 120R includes the insulating layer 221, the reflection layer 222, the reflection enhancing layer 223, the insulating layer 224, the first distance adjustment layer 225a, the second distance adjustment layer 225b, the pixel electrode 226R, the element separation layer 227, the organic layer 228, and the common electrode 229. The light-emitting device 120G1 has the same layer configuration as that of the light-emitting element 120R except that the first distance adjustment layer 225a is omitted and the pixel electrode 226G1 is included instead of the pixel electrode 226R. The light-emitting device 120G2 has the same layer configuration as that of the light-emitting element 120R except that the first distance adjustment layer 225a is omitted and the pixel electrode 226G2 is included instead of the pixel electrode 226R. The light-emitting device 120G1 has the same layer configuration as that of the light-emitting element 120R except that the first distance adjustment layer 225a and the second distance adjustment layer 225b are omitted and the pixel electrode 226B is included instead of the pixel electrode 226R.

Here, the distance between the reflection layer 222 and the common electrode 229 is different in each of the sub-pixels P0. Specifically, the distance in the sub-pixel PR is set so as to correspond to a wavelength region of red. The distance in the sub-pixel PG is set so as to correspond to a wavelength region of green. The distance in the sub-pixel PB is set so as to correspond to a wavelength region of blue.

Thus, in the sub-pixel PR, an optical resonance structure is realized that causes light having a wavelength of the red to resonate between the reflection layer 222 and the common electrode 229. In the sub-pixel PG, an optical resonance structure is realized that causes light having a wavelength of the green to resonate between the reflection layer 222 and the common electrode 229. In the sub-pixel PB, an optical resonance structure is realized that causes light having a wavelength of the blue to resonate between the reflection layer 222 and the common electrode 229.

Here, a resonant wavelength in the above-described optical resonance structure is determined by the distance between the reflection layer 222 and the common electrode 229. When the distance is L0 and the resonant wavelength is λ0, the following relational expression [1] is established. Note that in the relational expression [1], Φ (radian) represents the sum of phase shifts that occur during transmission and reflection between the reflection layer 222 and the common electrode 229.

$$\{(2 \times L0)/\lambda 0 + \Phi\}/(2\pi) = m0 \; (m0 \text{ is an integer}) \quad [1]$$

The distance L0 is set such that a peak wavelength of light of a wavelength region to be extracted is λ0. With this setting, the light in the predetermined wavelength region to be extracted is intensified, and thus, an increase in intensity of the light and narrowing of a spectrum of the light can be achieved.

As described above, in the present embodiment, the distance L0 is adjusted by varying the thickness of the distance adjustment layer 225 in each of the sub-pixels PB, PG, and PR. Note that an adjustment method of the distance L0 is not limited to the adjustment method using the thickness of the distance adjustment layer 255. For example, the distance L0 may be adjusted by varying the thickness of the pixel electrode 226 in each of the sub-pixel PB, PG, and PR.

The protective layer 230 is a layer having gas barrier properties and optical transparency, which protects the light-emitting element layer 220 from moisture, oxygen, or the like from the outside. Specifically, the protective layer 230 includes a first layer 231, a second layer 232, and a third layer 233. These layers are layered in this order in the direction Z1. Each of the first layer 231 and the third layer 233 is a layer having optical transparency for enhancing the gas barrier properties. Each of the first layer 231 and the third layer 233 is formed by a silicon oxynitride (SiON) film, for example. The second layer 232 is a layer having optical transparency, which provides a flat surface for the third layer 233. The second layer 232 is formed from a resin material such as an epoxy resin, for example.

The color filter 240 is a layer that selectively transmits light in the predetermined wavelength region, of the light from the light-emitting element 120. By using the color filter 240, color purity, in a desired color, of light emitted from each of the sub-pixels P0 can be increased compared to a case in which the color filter 240 is not provided. The color filter 240 is formed from a resin material such as an acrylic photosensitive resin material containing a color material, for example.

Specifically, the color filter 240 includes a filter 241R provided in the sub-pixel PR, a filter 241G provided in the sub-pixel PG, and a filter 241B provided in the sub-pixel PB. Here, the filter 241R is an example of a first filter, the filter 241G is an example of a second filter, and the filter 241B is an example of a third filter.

The filter 241R is a colored layer that selectively transmits light in the wavelength region of the red, of light from the light-emitting element 120R. The filter 241G is a colored layer that selectively transmits light in the wavelength region of the green, of light from the light-emitting elements 120G1 and 120G2. The filter 241B is a colored layer that selectively transmits light in the wavelength region of the blue, of light from the light-emitting element 120B.

As illustrated in FIG. 3, the filter 241R and the filter 241B are arranged side by side along the Y-axis. The filter 241R and the filter 241G are arranged side by side along the X-axis. The filter 241B and the filter 241G are arranged side by side along the X-axis. Here, the filter 241R has a rectangular shape having long sides along the X-axis in plan view. The filter 241B has a rectangular shape having long sides along the Y-axis in plan view. The filter 241G has a shape extending along the Y-axis in plan view. More specifically, the filter 241G includes a first portion 241G1 and a second portion 241G2 having different lengths along the X-axis, and these portions are arranged side by side along the Y-axis. Here, a length Lf21a of the first portion 241G1 along the X-axis is shorter than a length Lf21b of the second portion 241G2 along the X-axis. Further, the first portion 241G1 is adjacent to the filter 241R along the X-axis. The second portion 241G2 is adjacent to the filter 241B along the X-axis.

A length Lf11 of the filter 241R along the X-axis is longer than a length Le11 of the light-emitting region RR along the X-axis. A length Lf21 of the filter 241G along the X-axis is longer than a length Le21 of the light-emitting region RG along the X-axis. A length Lf31 of the filter 241B along the X-axis is longer than a length Le31 of the light-emitting region RB along the X-axis. Note that the "length" of each of the filters refers to a length of a region that functions as a filter, and is a length that does not include a length of a portion in which filters for different wavelength regions overlap.

Here, a difference (2× L×R) between the length Lf11 of the filter 241R and the length Le11 of the light-emitting region RR is longer than a difference (2× L×G) between the length Lf21 of the filter 241G and the length Le21 of the light-emitting region RG. More specifically, the difference (2×L×R) is longer than a difference (2×L×G1) between the length Lf21a of the first portion 241G1 and the length Le21 of the light-emitting region RG. Further, the difference (2×L×R) is longer than a difference (2×L×G2) between the length Lf21b of the second portion 241G2 and the length Le21 of the light-emitting region RG. Note that the length L×R corresponds to a distance between the outer edge of the filter 241R and the outer edge of the light-emitting region RR in plan view. The length LxG corresponds to a distance between the outer edge of the filter 241G and the outer edge of the light-emitting region RG in plan view.

Further, a difference (2×LxB) between the length Lf31 of the filter 241B and the length Le31 of the light-emitting region RB is equal to the difference (2×LxG2). Note that the length LxB corresponds to a distance between the outer edge of the filter 241B and the outer edge of the light-emitting region RB in plan view.

The above-described magnitude relationship between the difference (2×LxR) and the difference (2×LxG) is achieved by shifting the midpoint between the filter 241R and the filter 241G by a distance ΔLx in the direction X1, with respect to the midpoint between the light-emitting region RR and the light-emitting region RG.

Figure 6:
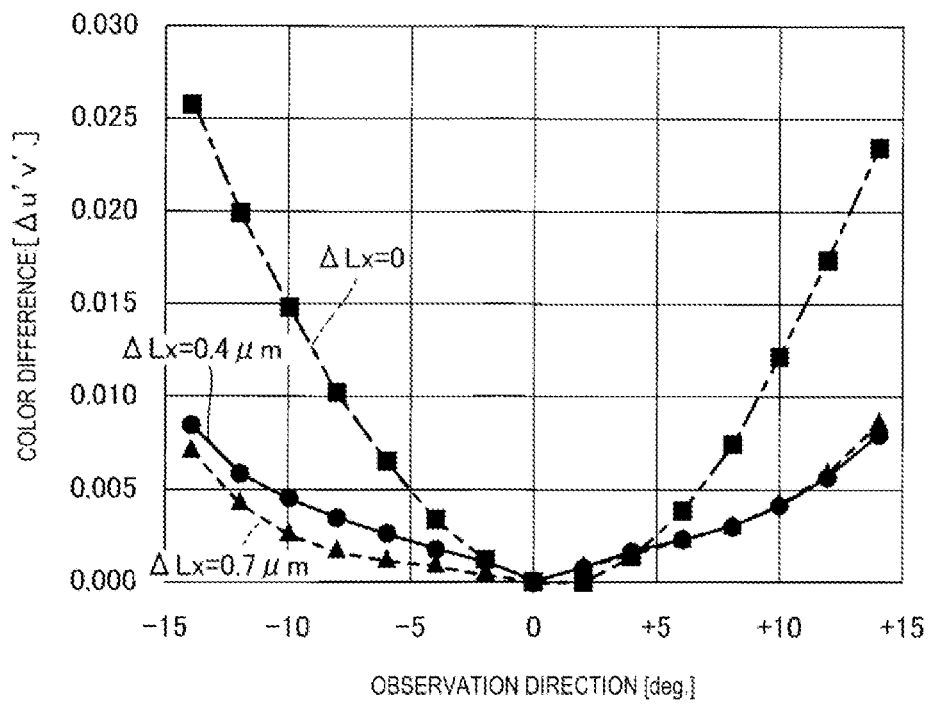
FIG. 6 is a graph showing a relationship between an observation direction and a color difference.

FIG. 6 is a graph showing a relationship between an observation direction and a color difference. In FIG. 6, a case in which the distance ΔLx is 0 μm is indicated by an alternate long and short dash line, a case in which the distance ΔLx is 0.4 μm is indicated by a solid line, and a case in which the distance ΔLx is 0.7 μm is indicated by a short dashed line. As can be seen from FIG. 6, the visual field angle is improved by causing the distance ΔLx to be greater than 0 μm. Note that the horizontal axis "observation direction" in FIG. 6 is an angle formed between a viewpoint and a normal line direction of a display surface of the electro-optical device 100, when the viewpoint is changed along the X-axis while using the normal line direction as a reference. Further, the vertical axis of the "color difference" in FIG. 6 indicates a difference with a display color, in a reference observation direction, which causes the electro-optical device 100 to emit white light.

The electro-optical device 100 described above includes the light-emitting element 120R, which is an example of the first light-emitting element, the light-emitting element 120G, which is an example of the second light-emitting element, the filter 241R, which is an example of the first filter, and the filter 241G, which is an example of the second filter. The light-emitting device 120R emits the light LLR, which is an example of the first light, from the light-emitting region RR, which is an example of the first light-emitting region. The light-emitting device 120G emits the light LLG, which is an example of the second light, from the light-emitting region RG, which is an example of the second light-emitting region. The filter 241R transmits light in a first wavelength region of the light LLR. The filter 241G transmits light in a second wavelength region, which is different from the first wavelength region, of the light LLG.

Here, the area of the light-emitting region RR is smaller than the area of the light-emitting region RG. Further, when the length of the light-emitting region RR along the X-axis, which is an example of a first axis, is Le11, the length of the light-emitting region RG along the X-axis is Le21, the length of the filter 241R along the X-axis is Lf11, and the length of the filter 241G along the X-axis is Lf21, the relationship (Lf11−Le11)>(Lf21−Le21) is satisfied.

When the area of the light-emitting region RR is smaller than the area of the light-emitting region RG, when the relationship (Lf11−Le11)=(Lf21−Le21) is satisfied, when the light-emitting regions RR and RG are observed in the observation direction that is inclined, with respect to the normal line of the display surface along the display region A10, as a result of changing the viewpoint along the X-axis, an attenuation ratio of the intensity of the light LLR becomes greater than an attenuation ratio of the intensity of the light LLR.

In contrast, by satisfying the relationship (Lf11−Le11)>(Lf21−Le21), it is possible to reduce such a difference between the attenuation ratio of the intensity of the light LLR and the attenuation ratio of the intensity of the light LLR in the observation direction. Thus, color changes due to the observation direction can be reduced, and as a result, the visual field angle can be increased compared to known art.

In the present embodiment, the light-emitting region RR and the light-emitting region RG are adjacent to each other along the X-axis. Thus, it is sufficient to make the length Lf21 of the filter 241G shorter than that of known art, by an amount corresponding to the length by which the length Lf11 of the filter 241R has been made longer. As a result, the relationship (Lf11−Le11)>(Lf21−Le21) is easily satisfied.

Further, in addition to the light-emitting elements 120R and 120G and the filters 241R and 241G, the electro-optical device 100 further includes the light-emitting element 120B, which is an example of the third light-emitting element, and the filter 241B, which is an example of the third filter. The light-emitting device 120B emits the light LLB, which is an example of the third light, from the light-emitting region RB, which is an example of a third light-emitting region. Of the light LLB, the filter 241B transmits light in a third wavelength region different from the first wavelength region and the second wavelength region.

Here, the light-emitting region RR and the light-emitting region RB are adjacent to each other along the Y-axis, which is an example of the second axis orthogonal to the X-axis. Further, each of the light-emitting regions RR and RB is adjacent to the light-emitting region RG along the X-axis. By disposing the light-emitting regions RR, RG, and RB in this manner, the red color, the green color, and the blue color can be displayed in the first wavelength region, the second wavelength region, and the third wavelength region, respectively, in a well-balanced manner.

Specifically, the first wavelength region is a wavelength region corresponding to the red color, the second wavelength region is a wavelength region corresponding to the blue color, and the third wavelength region is a wavelength region corresponding to the green color. Thus, full color display can be performed.

Further, the area of the light-emitting region RB is larger than the area of the light-emitting region RR, and is smaller than the area of the light-emitting region RG. Here, when the length of the light-emitting region RB along the X-axis is Le31 and the length of the filter 241B along the X-axis is Lf31, the relationship (Lf11−Le11)>(Lf31−Le31) is satisfied. By satisfying this relationship, the attenuation ratio of the intensity of the light LLG due to the observation direction can be reduced. Further, by satisfying this relationship, there is also an advantage that a balance of the light LLR, LLG, and LLB with respect to the observation direction is easily achieved.

Furthermore, when the length of the light-emitting region RR along the Y-axis is Le12 and the length of the filter 241R along the Y-axis is Lf12, the relationship (Lf11−Le11)>(Lf12−Le12) is satisfied. By satisfying this relationship, there is an advantage that the intensity of the light LLR and the intensity of the light LLB are easily balanced.

Further, the filter 241G includes the first portion 241G1 and the second portion 241G2. Here, the length of the first portion 241G1 along the X-axis is shorter than the length of the second portion 241G2 along the X-axis. Further, the first portion 241G1 is adjacent to the filter 241R along the X-axis, and the second portion 241G2 is adjacent to the filter 241B along the X-axis. By configuring the first portion 241G1 and the second portion 241G2 in this manner, it is possible to prevent the light LLG from having insufficient intensity.

Furthermore, of the layer forming the filter 241R and the layer forming the filter 241G, an end of one of the layers overlaps with the other layer. Thus, the filters 241R and 241G can be easily manufactured compared to a case in which the filters 241R and 241G do not overlap with each other. For example, when forming the filters 241R and 241G by an application method such as a spin coating method, a possibility of formation of a region in which neither of those layers is present can be reduced. Further, since overlapping portions of the filters 241R and 241G have light-shielding properties, a possibility of light having a color deviating from the desired color being observed, when viewed from an oblique direction, can be reduced.

1B. Second Embodiment

Next, a second embodiment will be described. Note that, in each of exemplifications described below, with respect to elements having the same function as that of the first embodiment, the same reference signs used for describing the first embodiment will be used, and a detailed description of each of those elements will be omitted as appropriate.

Figure 7:
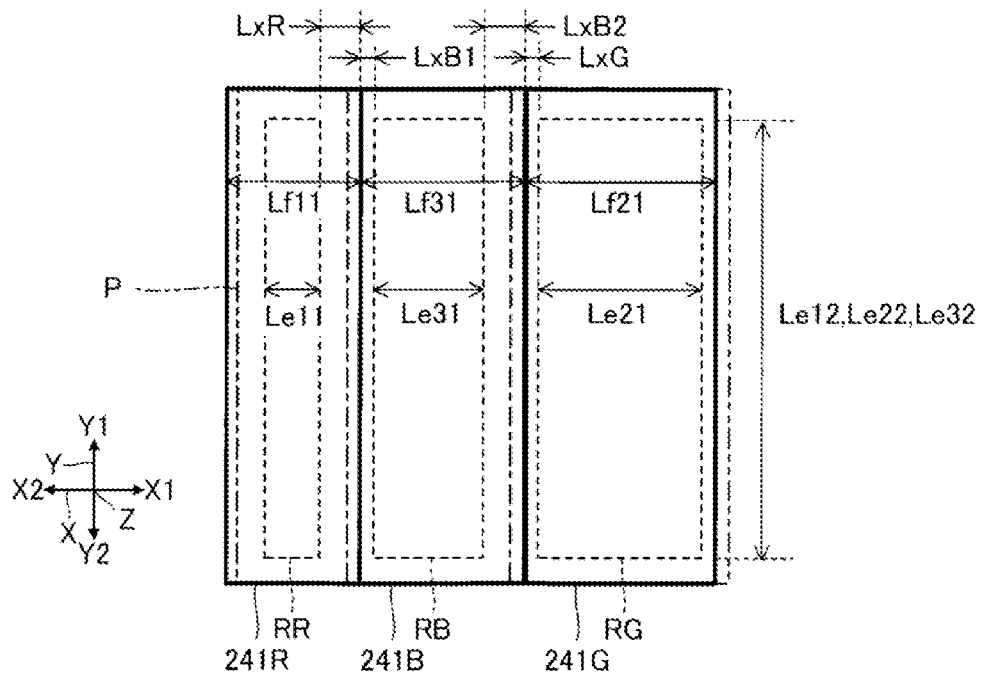
FIG. 7 is a plan view illustrating a pixel according to a second embodiment.

FIG. 7 is a plan view illustrating the pixel P according to the second embodiment. In FIG. 7, for convenience of explanation, portions in which the filters overlap with each other are not illustrated, and a positional relationship between each of the filters and each of the light-emitting regions in plan view is schematically illustrated.

In an example illustrated in FIG. 7, the light-emitting regions RR, RB, and RG are arranged side by side in this order in the direction X1. Here, the lengths of the light-emitting regions RR, RB, and RG along the Y-axis are equal to each other, but the lengths of the light-emitting regions RR, RB, and RG along the X-axis are different from each other. Specifically, the length Le11 of the light-emitting region RR along the X-axis, the length Le21 of the light-emitting region RG along the X-axis, and the length Le31 of the light-emitting region RB along the X-axis have a relationship Le11<Le21<Le31.

Therefore, of the areas of the light-emitting regions RR, RB, and RG, the area of the light-emitting region RR is smallest. Thus, similarly to the first embodiment described above, the difference (2×LxR) between the length Lf11 of the filter 241R and the length Le11 of the light-emitting region RR is longer than the difference (2×LxG) between the length Lf21 of the filter 241G and the length Le21 of the light-emitting region RG.

Here, in the present embodiment, the midpoint of the filter 241B is shifted in the direction X1 along the X-axis with respect to the midpoint of the light-emitting region RB. Therefore, a distance LxB1 between the outer edge of the filter 241R and the outer edge of the light-emitting region RB in plan view is smaller than a distance LxB2 between the outer edge of the filter 241G and the outer edge of the light-emitting region RB in plan view. In other words, the distance LxB2 is greater than the distance LxB1. As a result, a necessary area for the filter 241B can be easily secured.

With the above-described second embodiment also, the same effects as those of the first embodiment described above can be obtained.

1C. Third Embodiment

Next, a third embodiment will be described. Note that, in each of exemplifications described below, with respect to elements having the same function as that of the first embodiment, the same reference signs used for describing the first embodiment will be used, and a detailed description of each of those elements will be omitted as appropriate.

Figure 8:
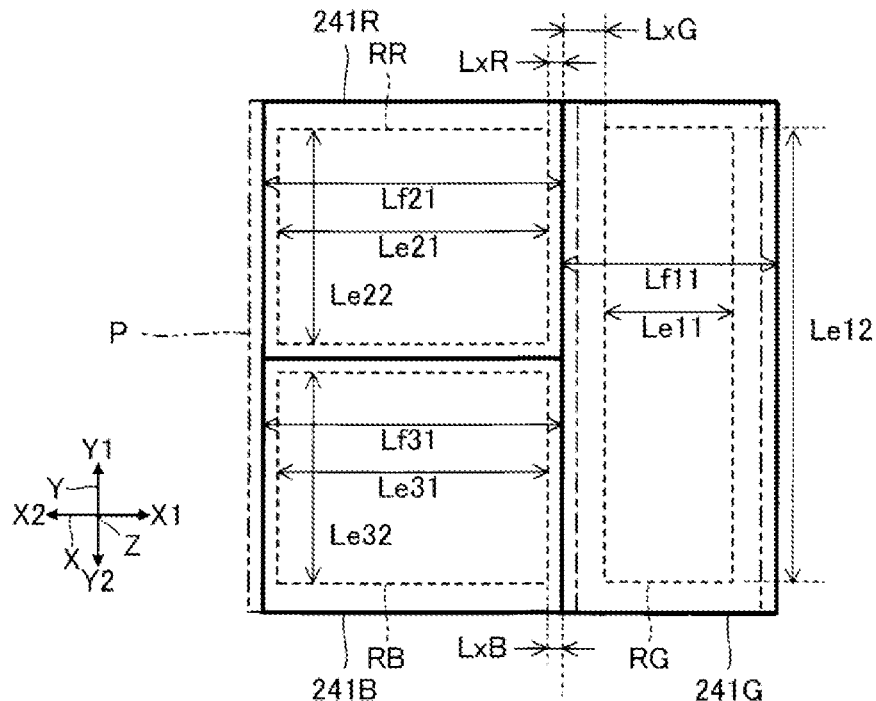
FIG. 8 is a plan view illustrating the pixel according to a third embodiment.

FIG. 8 is a plan view illustrating the pixel P according to the third embodiment. In FIG. 8, for convenience of explanation, the portions in which the filters overlap with each other are not illustrated, and the positional relationship between each of the filters and each of the light-emitting regions in plan view is schematically illustrated.

In an example illustrated in FIG. 8, the areas of the light-emitting regions RR, RB, and RG are equal to each other. Here, the shapes of the light-emitting regions RR and RB are also identical to each other. Further, each of the light-emitting regions RR and RB forms a rectangular shape having long sides thereof along the X-axis. The light-emitting regions RR and RB are adjacent to each other along the Y-axis. In contrast, the light-emitting region RG has a rectangular shape having long sides thereof along the Y-axis. The light-emitting region RG is adjacent to each of the light-emitting regions RR and RB along the X-axis.

In the present embodiment, the light-emitting region RG is an example of the first light-emitting region, and each of the light-emitting regions RR and RB is an example of the second light-emitting region. Here, the length Le11 of the light-emitting region RG along the X-axis is shorter than each of the length Le21 of the light-emitting region RR along the X-axis and the length Le31 of the light-emitting region RB along the X-axis. Further, the length Le12 of the light-emitting region RG along the Y-axis is longer than each of the length Le22 of the light-emitting region RR along the Y-axis and the length Le32 of the light-emitting region RB along the Y-axis.

Further, in the present embodiment, the filter 241G is an example of the first filter, and each of the filters 241R and 241B is an example of the second filter. Here, the difference (2×LxG) between the length Lf11 of the filter 241G and the length Le11 of the light-emitting region RG is longer than the difference (2×LxR) between the length Lf21 of the filter 241R and the length Le21 of the light-emitting region RR. Similarly, the difference (2×LxG) between the length Lf11 of the filter 241G and the length Le11 of the light-emitting region RG is longer than the difference (2×LxB) between the length Lf31 of the filter 241B and the length Le31 of the light-emitting region RB.

As described above, when the length of the light-emitting region RG along the X-axis is Le11, the length of the light-emitting region RG along the Y-axis is Le12, the length of the light-emitting region RR along the X-axis is Le21, the length of the light-emitting region RR along the Y-axis is Le22, the length of the filter 241G along the X-axis is Lf11, and the length of the filter 241R along the X-axis is Lf21, the relationships of Le11<Le21, Le12>Le2, and (Lf11−Le11)>(Lf21−Le21) are satisfied.

When the relationships of Le11<Le21 and Le12>Le22 are satisfied, if the relationship (Lf11−Le11)=(Lf21−Le21) is satisfied, even when the areas of the light-emitting regions RG and RR are equal to each other, when the light-emitting regions RG and RR are observed while changing the observation direction by changing the viewpoint along the X-axis, the attenuation ratio of the intensity of the first light from the light-emitting region RG becomes greater than the attenuation ratio of the intensity of the second light from the light-emitting region RR.

In contrast, by satisfying the relationship (Lf11−Le11)>(Lf21−Le21), such a difference between the attenuation ratio of the intensity of the first light and the attenuation ratio of the intensity of the second light in the observation direction can be reduced. Thus, the color changes due to the observation direction can be reduced, and as a result, the visual field angle can be increased compared to the known art.

1D. Fourth Embodiment

Next, a fourth embodiment will be described. Note that, in each of exemplifications described below, with respect to elements having the same function as that of the first embodiment, the same reference signs used for describing the first embodiment will be used, and a detailed description of each of those elements will be omitted as appropriate.

Figure 9:
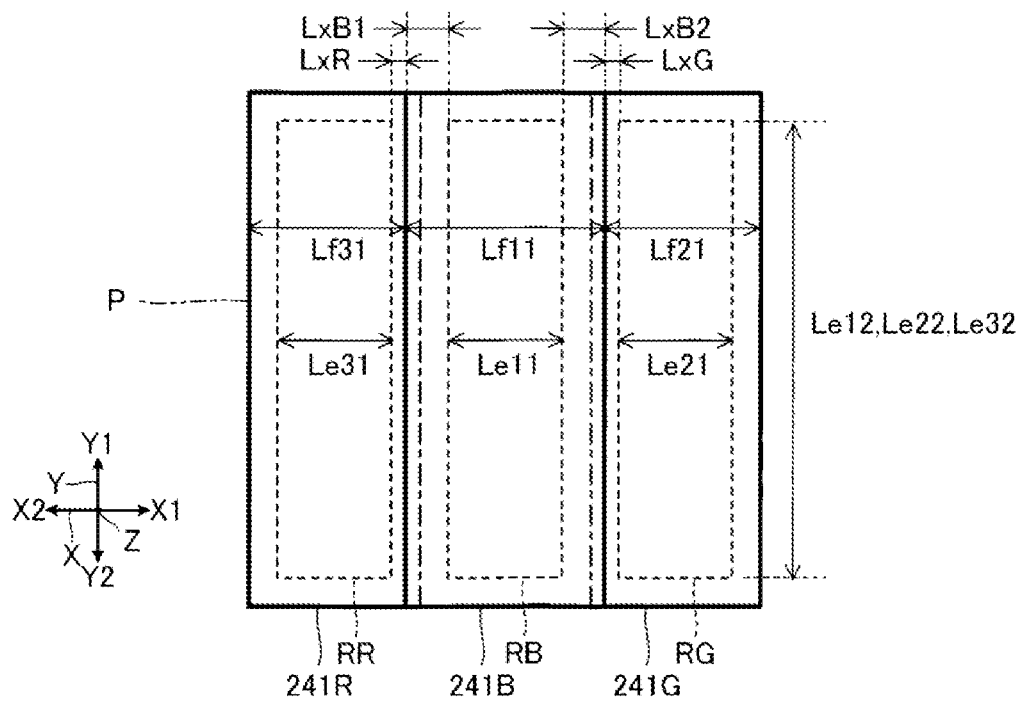
FIG. 9 is a plan view illustrating the pixel according to a fourth embodiment.

FIG. 9 is a plan view illustrating the pixel P according to the fourth embodiment. In FIG. 9, for convenience of explanation, the portions in which the filters overlap with each other are not illustrated, and the positional relationship between each of the filters and each of the light-emitting regions in plan view is schematically illustrated.

In an example illustrated in FIG. 9, the light-emitting regions RR, RB, and RG are arranged side by side in this order in the direction X1. Here, the areas and shapes of the light-emitting regions RR, RB, and RG are identical to each other.

In the present embodiment, the light-emitting region RB is an example of the first light-emitting region emitting the first light, and each of the light-emitting regions RR and RG is an example of the second light-emitting region emitting the second light. The filter 241B is an example of the first filter, and each of the filters 241G and 241R is an example of the second filter.

The spread angle of light from the light-emitting region RB is smaller than the spread angle of light from each of the light-emitting regions RR and RG. Thus, when the length of the light-emitting region RB along the X-axis is Le11, the length of the light-emitting region RG along the X-axis is Le21, the length of the filter 241B along the X-axis is Lf11, and the length of the filter 241G along the X-axis is Lf21, the relationship (Lf11−Le11)>(Lf21−Le21) is satisfied.

When the spread angle of the first light is smaller than the spread angle of the second light, if the relationship (Lf11−Le11)=(Lf21−Le21) is satisfied, when the light-emitting regions Rb and RG are observed while changing the observation direction by changing the viewpoint along the X-axis, the attenuation ratio of the intensity of the first light from the light-emitting region RB becomes greater than the attenuation ratio of the intensity of the second light from the light-emitting region RG.

In contrast, by satisfying the relationship (Lf11−Le11)>(Lf21−Le21), such a difference between the attenuation ratio of the intensity of the first light and the attenuation ratio of the intensity of the second light in the observation direction can be reduced. Thus, the color changes due to the observation direction can be reduced, and as a result, the visual field angle can be increased compared to the known art.

Here, the first light is light of a wavelength region closer to the first wavelength region than the second light. Further, the second light is light of a wavelength region closer to the second wavelength region than the first light. In this case, the spread angle of the first light is likely to be smaller than the spread angle of the second light.

For example, when the first light-emitting element having the light-emitting region RB, and the second light-emitting element having the light-emitting region RG or RR have different light-emitting layers, the spread angle of the first light is likely to be smaller than the spread angle of the second light. In this case, specifically, the first light-emitting element having the light-emitting region RB includes the blue light-emitting layer, but does not include the green light-emitting layer and the red light-emitting layer. The second light-emitting element having the light-emitting region RG includes the green light-emitting layer, but does not include the blue light-emitting layer and the red light-emitting layer. The second light-emitting element having the light-emitting region RR includes the red light-emitting layer, but does not include the blue light-emitting layer and the green light-emitting layer.

Figure 10:
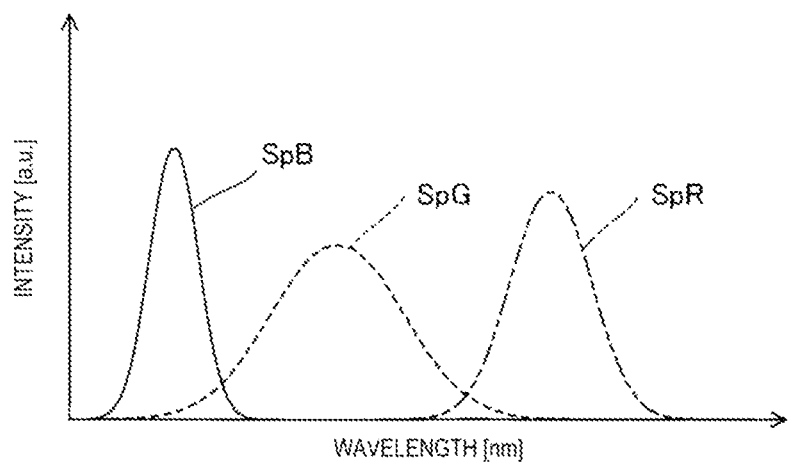
FIG. 10 is a diagram illustrating an example of a light emission spectrum of each of the sub-pixels according to the fourth embodiment.

FIG. 10 is a light emission spectrum of each of the sub-pixels P0 according to the fourth embodiment. In FIG. 10, a light emission spectrum SpR of the red light-emitting element is indicated by an alternate long and two short dashes line, a light emission spectrum SpG of the green light-emitting element is indicated by a dashed line, and a light emission spectrum SpB of the blue light-emitting element is indicated by a solid line. As illustrated in FIG. 10, a line width of the light emission spectrum SpB is narrower than a line width of each of the light emission spectra SpR and SpG. When the line widths have such a relationship, the spread angle of light from the blue light-emitting element is likely to be smaller than the spread angle of light from the green light-emitting element or light from the red light-emitting element.

Further, for example, when the first light-emitting element having the light-emitting region RB, and the second light-emitting element having the light-emitting region RG or RR have different resonance structures, the spread angle of the first light is likely to be smaller than the spread angle of the second light. In this case, specifically, as in the first embodiment described above, different resonance structures are provided for each of the sub-pixels.

Figure 11:
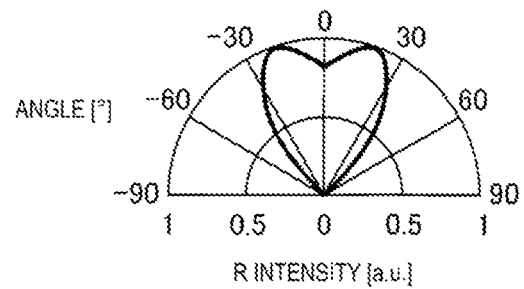
FIG. 11 is a diagram illustrating light distribution characteristics of each of the sub-pixels according to the fourth embodiment.
Figure 11:
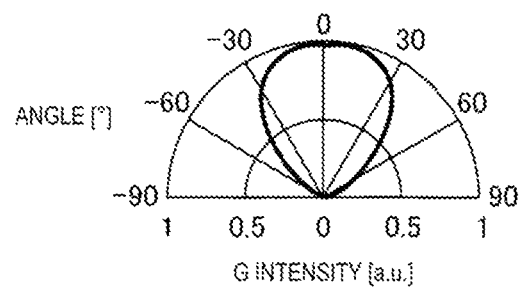
Figure 11:
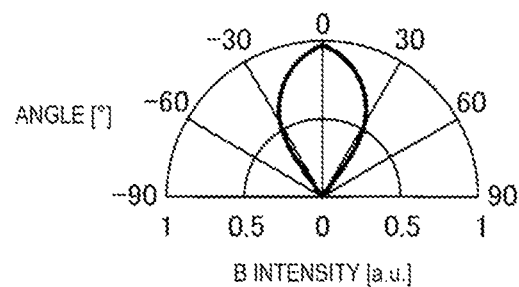

FIG. 11 is a diagram illustrating light distribution characteristics of each of the sub-pixels P0 according to the fourth embodiment. In FIG. 11, in the top row of the drawing, a light emission intensity distribution in the spread angle from an optical axis of the light-emitting element of the sub-pixel PR is illustrated, in the middle row of the drawing, a light emission intensity distribution in the spread angle from an optical axis of the light-emitting element of the sub-pixel PG is illustrated, and in the bottom row of the drawing, a light emission intensity distribution in the spread angle from an optical axis of the light-emitting element of the sub-pixel PB is illustrated. As illustrated in FIG. 11, the spread angle of light from the light-emitting element of the sub-pixel PB is smaller than the spread angle of light from the light-emitting element of the sub-pixel PR or PG.

1E. Fifth Embodiment

Next, a fifth embodiment will be described. Note that, in each of exemplifications described below, with respect to elements having the same function as that of the first embodiment, the same reference signs used for describing the first embodiment will be used, and a detailed description of each of those elements will be omitted as appropriate.

Figure 12:
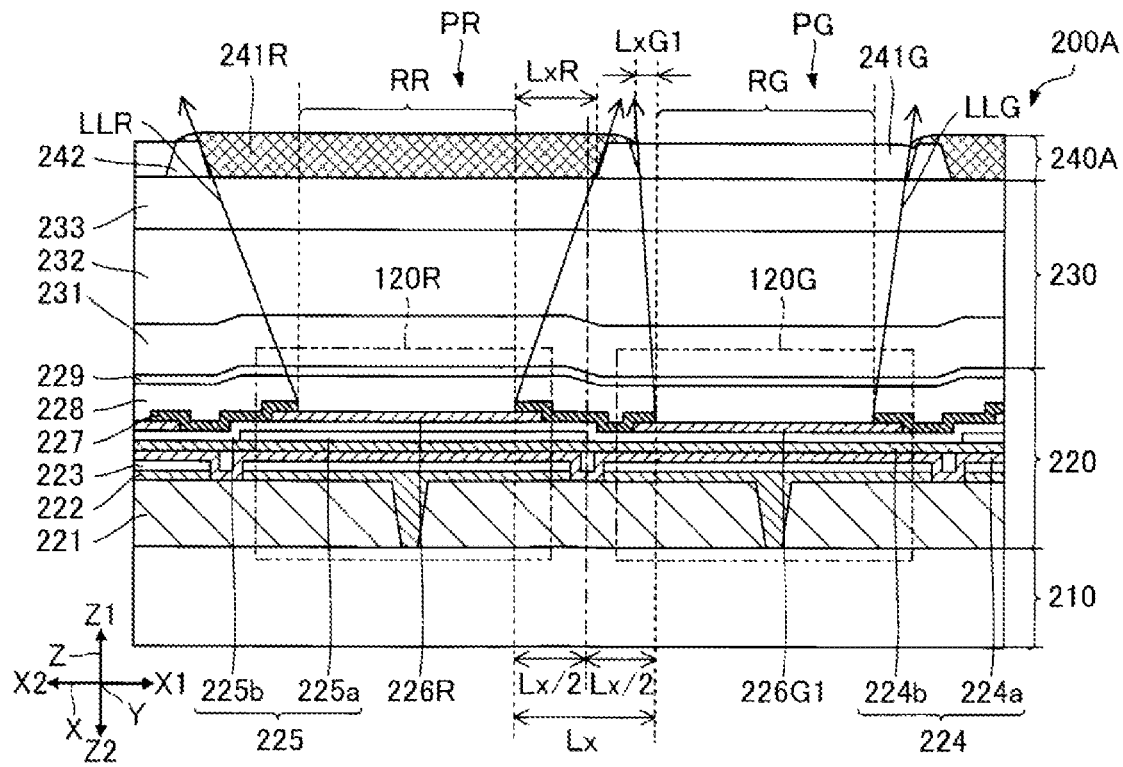
FIG. 12 is a cross-sectional view illustrating an element substrate according to a fifth embodiment.

FIG. 12 is a cross-sectional view illustrating an element substrate 200A according to the fifth embodiment. The element substrate 200A is the same as the element substrate 200 of the first embodiment described above, except that the element substrate 200A includes a color filter 240A instead of the color filter 240. The color filter 240A is the same as the color filter 240 of the first embodiment described above, except that the color filter 240A further includes wall portions 242.

The wall portions 242 are convex members that partition the filters 241R, 241G and 241B. The wall portion 242 is formed from a transparent resin material. Examples of the resin material include an epoxy resin, an acrylic resin, and the like.

As described above, the element substrate 200A further includes the wall portion 242 that is disposed between the filter 241R and the filter 241G and formed from the transparent resin material. Thus, each of the filters can be easily manufactured compared to a case in which the wall portions 242 are not provided. For example, when the filters 241R and 241G are formed using an ink-jet method, each of the filters can be formed using the wall portion 242 as a partition wall. Further, there is also an advantage that the thickness of each of the filters is easily adjusted.

1F. Modified Examples

Each of the embodiments exemplified above can be modified in various manners. Specific modified aspects applied to each of the embodiments described above will be exemplified below. Two or more aspects freely selected from exemplifications described below can be appropriately used in combination as long as mutual contradiction does not arise. Further, each of modified aspects of the first embodiment, which will be described below, is applied to the second embodiment as appropriate as long as mutual contradiction does not arise.

In the first embodiment, the light-emitting device 120 has the optical resonance structure having the different resonant wavelength for each of the colors, but need not necessarily include the optical resonance structure. Further, the light-emitting element layer 220 may include, for example, a partition wall that partitions the organic layer 228 for each of the light-emitting elements 120. Further, the light-emitting element 120 may contain a different light-emitting material for each of the sub-pixels P0. Further, the pixel electrode 226 may have light reflectivity. In that case, the reflection layer 222 may be omitted. Further, although the common electrode 229 is commonly used among the plurality of light-emitting elements 120, a cathode may be provided for each of the light-emitting elements 120.

Further, a so-called black matrix may be interposed between the filters of the color filters 240.

Further, although, in the above-described embodiments, a configuration for improving the visual field angle in a case in which the viewpoint changes along the X-axis is exemplified, the present disclosure is not limited to this example. For example, if the visual field angle needs to be improved in a case in which the viewpoint changes along the Y-axis, a configuration may be used that is obtained by rotating the above-described configuration about the X-axis by 90 degrees.

Further, although, in the above-described embodiments, the shape of each of the sub-pixels PB, PG, and PR in plan view is a substantially quadrangular shape, each of the sub-pixels PB, PG, and PR may have another shape. Further, an array of the sub-pixels PB, PG, and PR is not particularly limited. Examples of the array include a stripe array, a rectangular array, the Bayer array, or a delta array.

2. Electronic Apparatus

The electro-optical device 100 of the above-described embodiments can be applied to various electronic apparatuses.

2-1. Head-Mounted Display

Figure 13:
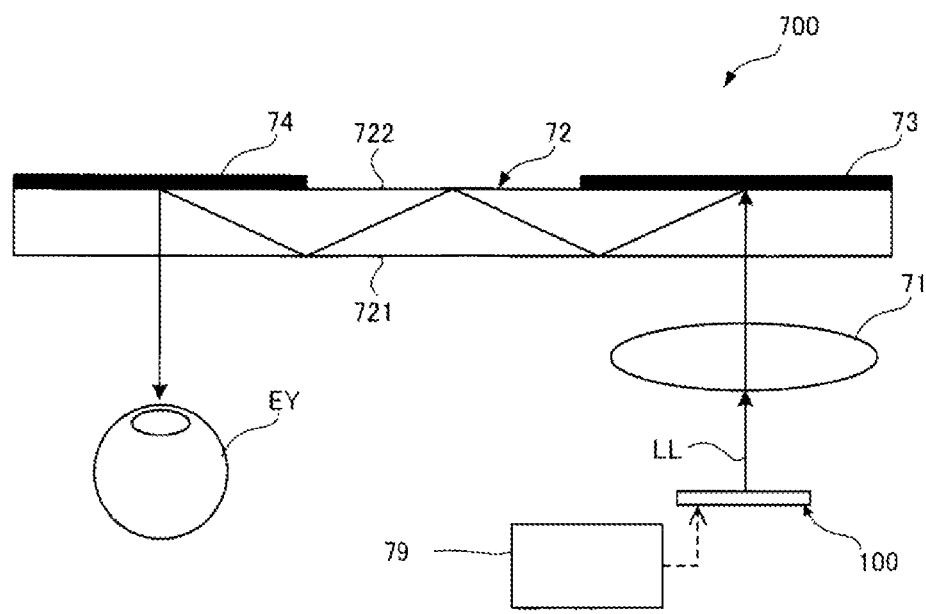
FIG. 13 is a diagram schematically illustrating a virtual image display device as an example of an electronic apparatus.

FIG. 13 is a plan view schematically illustrating a part of a virtual display apparatus 700 as an example of an electronic apparatus. The virtual display apparatus 700 illustrated in FIG. 13 is a head-mounted display (HMD) mounted on a head of an observer and configured to display an image. The virtual display apparatus 700 includes the electro-optical device 100 described above, a collimator 71, a light guide 72, a first reflection-type volume hologram 73, a second reflection-type volume hologram 74, and a control unit 79. Note that light emitted from the electro-optical device 100 is emitted as image light LL. Further, an electro-optical device 100A may be used instead of the electro-optical device 100.

The control unit 79 includes a processor and a memory, for example, and controls the operation of the electro-optical device 100. The collimator 71 is disposed between the electro-optical device 100 and the light guide 72. The collimator 71 collimates light emitted from the electro-optical device 100. The collimator 71 is configured by a collimating lens or the like. The light collimated by the collimator 71 is incident on the light guide 72.

The light guide 72 has a flat plate shape, and is disposed so as to extend in a direction intersecting a direction of light incident via the collimator 71. The light guide 72 reflects and guides light in the interior thereof. A light incidence port on which light is incident and a light emission port from which light is emitted are provided in a surface 721 of the light guide 72 facing the collimator 71. The first reflection-type volume hologram 73 that is a diffractive optical element and the second reflection-type volume hologram 74 that is a diffractive optical element are disposed on a surface 722 of the light guide 72, on the opposite side from the surface 721. The first reflection-type volume hologram 73 is provided closer to the light emission port side than to the second reflection-type volume hologram 74. The first reflection-type volume hologram 73 and the second reflection-type volume hologram 74 have interference fringes corresponding to a predetermined wavelength region, and diffract and reflect light in the predetermined wavelength region.

In the virtual display apparatus 700 having such a configuration, the image light LL incident on the light guide 72 from the light incidence port travels while being repeatedly reflected, and is guided to an eye EY of the observer. Thus, the observer can observe an image configured by a virtual image formed by the image light LL.

The above-described virtual display apparatus 700 includes the electro-optical device 100, and the control unit 79 that controls the operation of the electro-optical device 100. Therefore, the virtual display apparatus 700 having superior visual field angle characteristics to those of the known art can be provided.

Note that the virtual display apparatus 700 may include a synthetic element, such as a dichroic prism, that synthesizes light emitted from the electro-optical device 100. In that case, the virtual display apparatus 700 may include, for example, the electro-optical device 100 that emits light in the wavelength region of the blue, the electro-optical device 100 that emits light in the wavelength region of the green, and the electro-optical device 100 that emits light in the wavelength region of the red.

2-2. Personal Computer

Figure 14:
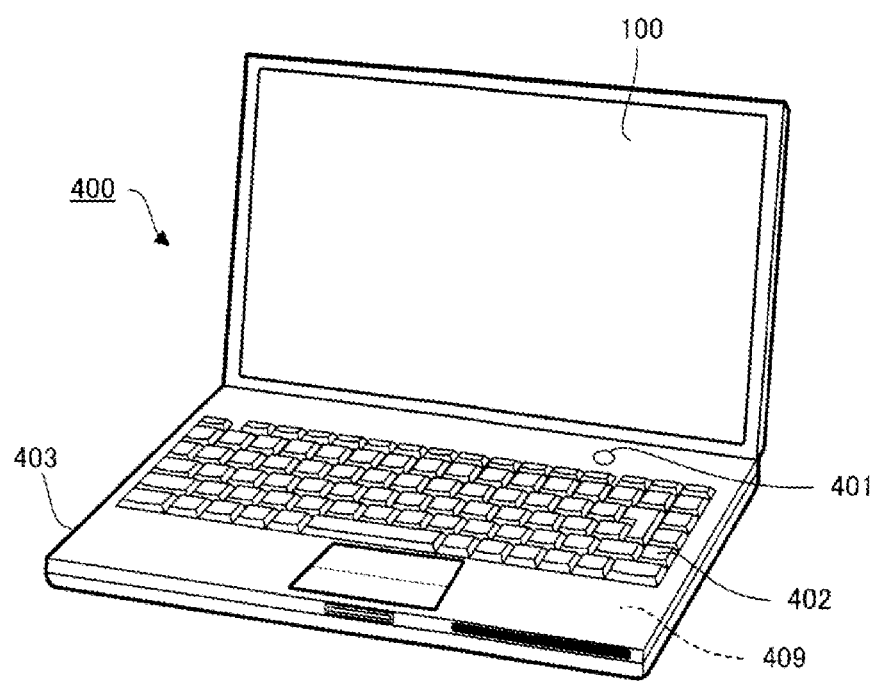
FIG. 14 is a perspective view illustrating a personal computer as an example of the electronic apparatus.

FIG. 14 is a perspective view illustrating a personal computer 400 as an example of the electronic apparatus according to the present disclosure. A personal computer 400 illustrated in FIG. 14 includes the electro-optical device 100, a main body 403 provided with a power switch 401 and a keyboard 402, and a control unit 409. The control unit 409 includes a processor and a memory, for example, and controls the operation of the electro-optical device 100. The personal computer 400 includes the above-described electro-optical device 100, and thus has excellent quality. Note that the electro-optical device 100A may be used instead of the electro-optical device 100.

Note that examples of the "electronic apparatus" including the electro-optical device 100 include, in addition to the virtual display apparatus 700 exemplified in FIG. 13 and the personal computer 400 exemplified in FIG. 14, apparatuses disposed close to eyes such as a digital scope, a digital binocular, a digital still camera, and a video camera. Further, the "electronic apparatus" including the electro-optical device 100 is applied as a mobile phone, a smartphone, a personal digital assistant (PDA), a car navigation device, and a vehicle-mounted display unit. Furthermore, the "electronic apparatus" including the electro-optical device 100 is applied as illumination for illuminating light.

The present disclosure is described above based on the illustrated embodiments. However, the present disclosure is not limited thereto. In addition, the configuration of each component of the present disclosure may be replaced with any configuration that exerts the equivalent functions of the above-described embodiments, and to which any configuration may be added. Further, any configuration of each of the above-described embodiments of the present disclosure may be combined with each other.

What is claimed is:

1. An electro-optical device comprising:
   a first light-emitting element configured to emit first light from a first light-emitting region;
   a second light-emitting element configured to emit second light from a second light-emitting region;
   a first filter configured to transmit, of the first light, light in a first wavelength region; and
   a second filter configured to transmit, of the second light, light in a second wavelength region different from the first wavelength region, wherein
   an area of the first light-emitting region is smaller than an area of the second light-emitting region, and
   (Lf11−Le11)>(Lf21−Le21), where a length of the first light-emitting region along a first axis is Le11, a length of the second light-emitting region along the first axis is Le21, a length of the first filter along the first axis is Lf11, and a length of the second filter along the first axis is Lf21.

2. The electro-optical device according to claim 1, wherein
   the first light-emitting region and the second light-emitting region are adjacent to each other along the first axis.

3. The electro-optical device according to claim 2, further comprising:
   a third light-emitting element configured to emit third light from a third light-emitting region; and
   a third filter configured to transmit, of the third light, light in a third wavelength region different from the first wavelength region and the second wavelength region, wherein
   the first light-emitting region and the third light-emitting region are adjacent to each other along a second axis that intersects the first axis, and
   each of the first light-emitting region and the third light-emitting region is adjacent to the second light-emitting region along the first axis.

4. The electro-optical device according to claim 3, wherein
   an area of the third light-emitting region is larger than the area of the first light-emitting region and smaller than the area of the second light-emitting region, and
   (Lf11−Le11)>(Lf31−Le31), where a length of the third light-emitting region along the first axis is Le31, and a length of the third filter along the first axis is Lf31.

5. The electro-optical device according to claim 4, wherein
   (Lf11−Le11)>(Lf12−Le12), where a length of the first light-emitting region along the second axis is Le12, and a length of the first filter along the second axis is Lf12.

6. The electro-optical device according to claim 4, wherein
   the second filter includes a first portion and a second portion,
   a length of the first portion along the first axis is shorter than a length of the second portion along the first axis,
   the first portion is adjacent to the first filter along the first axis, and
   the second portion is adjacent to the third filter along the first axis.

7. The electro-optical device according to claim 6, wherein
   the first wavelength region is a wavelength region corresponding to red,
   the second wavelength region is a wavelength region corresponding to blue, and
   the third wavelength region is a wavelength region corresponding to green.

8. The electro-optical device according to claim 1, wherein
   an end of one layer of a layer forming the first filter and a layer forming the second filter overlaps the other layer.

9. The electro-optical device according to claim 1, further comprising:
   a wall portion that is disposed between the first filter and the second filter, and includes a transparent resin material.

10. An electro-optical device comprising:
    a first light-emitting element configured to emit first light from a first light-emitting region;
    a second light-emitting element configured to emit second light from a second light-emitting region;
    a first filter configured to transmit, of the first light, light in a first wavelength region; and
    a second filter configured to transmit, of the second light, light in a second wavelength region different from the first wavelength region, wherein
    Le11<Le21, Le12>Le22, and (Lf11−Le11)>(Lf21−Le21), where a length of the first light-emitting region along a first axis is Le11, a length of the first light-emitting region along a second axis that intersects the first axis is Le12, a length of the second light-emitting region along the first axis is Le21, a length of the second light-emitting region along the second axis is Le22, a length of the first filter along the first axis is Lf11, and a length of the second filter along the first axis is Lf21.

11. An electro-optical device comprising:
    a first light-emitting element configured to emit first light from a first light-emitting region;
    a second light-emitting element configured to emit second light from a second light-emitting region;

a first filter configured to transmit, of the first light, light in a first wavelength region; and a second filter configured to transmit, of the second light, light in a second wavelength region different from the first wavelength region, wherein a spread angle of the first light is smaller than a spread angle of the second light, and $(Lf11-Le11) > (Lf21-Le21)$, where a length of the first light-emitting region along a first axis is Le11, a length of the second light-emitting region along the first axis is Le21, a length of the first filter along the first axis is Lf11, and a length of the second filter along the first axis is Lf21.

12. The electro-optical device according to claim 11, wherein the first light is light of a wavelength region closer to the first wavelength region than the second light is, and the second light is light of a wavelength region closer to the second wavelength region than the first light is.

13. The electro-optical device according to claim 12, wherein the first light-emitting element and the second light-emitting element include light-emitting layers that are mutually different.

14. The electro-optical device according to claim 12, wherein the first light-emitting element and the second light-emitting element have mutually different resonance structures.

15. An electronic apparatus comprising:

the electro-optical device according to claim 1; and a control unit configured to control operation of the electro-optical device.

* * * * *